(12) United States Patent
Busch et al.

(10) Patent No.: US 9,076,680 B2
(45) Date of Patent: Jul. 7, 2015

(54) INTEGRATED CIRCUITRY, METHODS OF FORMING CAPACITORS, AND METHODS OF FORMING INTEGRATED CIRCUITRY COMPRISING AN ARRAY OF CAPACITORS AND CIRCUITRY PERIPHERAL TO THE ARRAY

(75) Inventors: Brett W. Busch, Boise, ID (US); Mingtao Li, Boise, ID (US); Jennifer Lequn Liu, Boise, ID (US); Kevin R. Shea, Boise, ID (US); Belford T. Coursey, Boise, ID (US); Jonathan T. Doebler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 13/276,125

(22) Filed: Oct. 18, 2011

(65) Prior Publication Data

US 2013/0093050 A1 Apr. 18, 2013

(51) Int. Cl.
*H01L 27/10* (2006.01)
*H01L 27/108* (2006.01)
*H01L 49/02* (2006.01)

(52) U.S. Cl.
CPC .... *H01L 27/10852* (2013.01); *H01L 27/10894* (2013.01); *H01L 28/91* (2013.01)

(58) Field of Classification Search
CPC .................................................. H01L 29/66181
USPC .................. 438/243; 257/E27.092, E21.651, 257/E21.66, E21.532
See application file for complete search history.

(56) References Cited

U.S. PATENT DOCUMENTS

| | | | |
|---|---|---|---|
| 4,517,729 | A | 5/1985 | Batra |
| 4,871,688 | A | 10/1989 | Lowrey |
| 5,047,117 | A | 9/1991 | Roberts |
| 5,053,351 | A | 10/1991 | Fazan et al. |
| 5,155,657 | A | 10/1992 | Oehrlein et al. |
| 5,236,860 | A | 8/1993 | Fazan et al. |
| 5,252,517 | A | 10/1993 | Blalock et al. |
| 5,254,218 | A | 10/1993 | Roberts et al. |
| 5,328,810 | A | 7/1994 | Lowrey et al. |

(Continued)

FOREIGN PATENT DOCUMENTS

| | | |
|---|---|---|
| CN | 1230778 | 10/1999 |
| CN | 1761063 | 4/2006 |

(Continued)

OTHER PUBLICATIONS

U.S. Appl. No. 12/854,446, filed Aug. 11, 2010, Lee.

(Continued)

*Primary Examiner* — Matthew Reames
(74) *Attorney, Agent, or Firm* — Wells St. John P.S.

(57) ABSTRACT

A method of forming capacitors includes providing a support material over a substrate. The support material is at least one of semiconductive or conductive. Openings are formed into the support material. The openings include at least one of semiconductive or conductive sidewalls. An insulator is deposited along the semiconductive and/or conductive opening sidewalls. A pair of capacitor electrodes having capacitor dielectric there-between is formed within the respective openings laterally inward of the deposited insulator. One of the pair of capacitor electrodes within the respective openings is laterally adjacent the deposited insulator. Other aspects are disclosed, including integrated circuitry independent of method of manufacture.

40 Claims, 6 Drawing Sheets

(56) References Cited

U.S. PATENT DOCUMENTS

| | | |
|---|---|---|
| 5,338,700 A | 8/1994 | Dennison et al. |
| 5,340,763 A | 8/1994 | Dennison |
| 5,372,916 A | 12/1994 | Ogawa et al. |
| 5,401,681 A | 3/1995 | Dennison |
| 5,467,305 A | 11/1995 | Bertin et al. |
| 5,498,562 A | 3/1996 | Dennison et al. |
| 5,532,089 A | 7/1996 | Adair et al. |
| 5,563,089 A | 10/1996 | Jost et al. |
| 5,571,742 A | 11/1996 | Jeong |
| 5,573,837 A | 11/1996 | Roberts et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,672,534 A | 9/1997 | Huang |
| 5,686,747 A | 11/1997 | Jost et al. |
| 5,702,990 A | 12/1997 | Jost et al. |
| 5,705,838 A | 1/1998 | Jost et al. |
| 5,739,068 A | 4/1998 | Jost et al. |
| 5,763,910 A | 6/1998 | Ema |
| 5,767,561 A | 6/1998 | Frei et al. |
| 5,792,691 A | 8/1998 | Koga |
| 5,821,140 A | 10/1998 | Jost et al. |
| 5,821,142 A | 10/1998 | Sung et al. |
| 5,827,766 A | 10/1998 | Lou |
| 5,869,382 A | 2/1999 | Kubota |
| 5,874,756 A | 2/1999 | Ema et al. |
| 5,900,660 A | 5/1999 | Jost et al. |
| 5,905,279 A | 5/1999 | Nitayama et al. |
| 5,955,758 A | 9/1999 | Sandhu et al. |
| 5,956,594 A | 9/1999 | Yang et al. |
| 5,972,757 A | 10/1999 | Ema |
| 5,981,350 A | 11/1999 | Geusic et al. |
| 5,981,992 A | 11/1999 | Calpine Kenney |
| 5,989,953 A | 11/1999 | Liang et al. |
| 5,990,021 A | 11/1999 | Prall et al. |
| 5,998,251 A | 12/1999 | Wu et al. |
| 6,037,212 A | 3/2000 | Chao |
| 6,037,218 A | 3/2000 | Dennison et al. |
| 6,037,261 A | 3/2000 | Jost et al. |
| 6,059,553 A | 5/2000 | Jin et al. |
| 6,063,688 A | 5/2000 | Doyle et al. |
| 6,090,700 A | 7/2000 | Tseng |
| 6,097,055 A | 8/2000 | Lee et al. |
| 6,108,191 A | 8/2000 | Bruchhaus et al. |
| 6,110,774 A | 8/2000 | Jost et al. |
| 6,117,790 A | 9/2000 | Schafer et al. |
| 6,121,084 A | 9/2000 | Coursey |
| 6,133,620 A | 10/2000 | Uochi |
| 6,140,217 A | 10/2000 | Jones et al. |
| 6,153,527 A | 11/2000 | Jost et al. |
| 6,159,818 A | 12/2000 | Durcan et al. |
| 6,159,820 A | 12/2000 | Park |
| 6,180,450 B1 | 1/2001 | Dennison |
| 6,204,143 B1 | 3/2001 | Roberts et al. |
| 6,204,178 B1 | 3/2001 | Marsh |
| 6,225,184 B1 | 5/2001 | Hayashi et al. |
| 6,232,168 B1 | 5/2001 | Coursey |
| 6,245,684 B1 | 6/2001 | Zhao et al. |
| 6,249,019 B1 | 6/2001 | Sandhu et al. |
| 6,249,335 B1 | 6/2001 | Hirukawa et al. |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,329,683 B2 | 12/2001 | Kohyama |
| 6,331,461 B1 | 12/2001 | Juengling |
| 6,335,552 B1 | 1/2002 | Mitani |
| 6,372,554 B1 | 4/2002 | Kawakita et al. |
| 6,372,574 B1 | 4/2002 | Lane et al. |
| 6,383,861 B1 | 5/2002 | Gonzalez et al. |
| 6,383,952 B1 | 5/2002 | Subramanian et al. |
| 6,395,599 B1 | 5/2002 | Ema et al. |
| 6,395,613 B1 | 5/2002 | Juengling |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,475,855 B1 | 11/2002 | Fishburn |
| 6,476,432 B1 | 11/2002 | Basceri et al. |
| 6,476,437 B2 | 11/2002 | Liaw |
| 6,482,749 B1 | 11/2002 | Billington et al. |
| 6,483,136 B1 | 11/2002 | Yoshida et al. |
| 6,486,531 B2 | 11/2002 | Oh |
| 6,545,904 B2 | 4/2003 | Tran |
| 6,548,401 B1 | 4/2003 | Trivedi |
| 6,566,280 B1 | 5/2003 | Meagley et al. |
| 6,576,527 B2 | 6/2003 | Nakamura |
| 6,580,136 B2 | 6/2003 | Mandelman et al. |
| 6,583,063 B1 | 6/2003 | Khan et al. |
| 6,599,844 B2 | 7/2003 | Koh et al. |
| 6,605,541 B1 | 8/2003 | Yu |
| 6,617,222 B1 | 9/2003 | Coursey |
| 6,620,680 B2 | 9/2003 | Durcan et al. |
| 6,620,724 B1 | 9/2003 | Schroeder et al. |
| 6,627,524 B2 | 9/2003 | Scott |
| 6,630,379 B2 | 10/2003 | Mandelman et al. |
| 6,638,441 B2 | 10/2003 | Chang et al. |
| 6,645,869 B1 | 11/2003 | Chu et al. |
| 6,649,956 B2 | 11/2003 | Yoshida et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,696,745 B2 | 2/2004 | Sandhu et al. |
| 6,703,273 B2 | 3/2004 | Wang et al. |
| 6,703,323 B2 | 3/2004 | Kong et al. |
| 6,707,088 B2 | 3/2004 | Fishburn |
| 6,709,978 B2 | 3/2004 | Geusic et al. |
| 6,710,390 B2 | 3/2004 | Parekh et al. |
| 6,720,232 B1 | 4/2004 | Tu et al. |
| 6,727,540 B2 | 4/2004 | Divakaruni et al. |
| 6,730,574 B2 | 5/2004 | Ema et al. |
| 6,735,132 B2 | 5/2004 | Siek |
| 6,744,091 B1 | 6/2004 | Ema et al. |
| 6,753,220 B2 | 6/2004 | Juengling |
| 6,756,619 B2 | 6/2004 | Tran |
| 6,767,789 B1 | 7/2004 | Bronner et al. |
| 6,784,112 B2 | 8/2004 | Arita et al. |
| 6,784,479 B2 | 8/2004 | Park |
| 6,787,833 B1 | 9/2004 | Fishburn |
| 6,791,187 B2 | 9/2004 | Ema et al. |
| 6,812,513 B2 | 11/2004 | Geusic et al. |
| 6,822,261 B2 | 11/2004 | Yamazaki et al. |
| 6,822,280 B2 | 11/2004 | Ito et al. |
| 6,826,069 B2 | 11/2004 | Kurjanowicz et al. |
| 6,844,230 B2 | 1/2005 | Reinberg |
| 6,849,496 B2 | 2/2005 | Jaiprakash et al. |
| 6,853,023 B2 | 2/2005 | Goebel |
| 6,861,330 B2 | 3/2005 | Basceri et al. |
| 6,861,694 B2 | 3/2005 | Nakamura |
| 6,872,512 B2 | 3/2005 | Yamashita |
| 6,890,814 B2 | 5/2005 | Sandhu et al. |
| 6,893,914 B2 | 5/2005 | Kim et al. |
| 6,897,109 B2 | 5/2005 | Jin et al. |
| 6,905,975 B2 | 6/2005 | Boettiger et al. |
| 6,906,374 B2 | 6/2005 | Tanaka |
| 6,927,122 B2 | 8/2005 | Geusic et al. |
| 6,927,170 B2 | 8/2005 | Zheng |
| 6,930,640 B2 | 8/2005 | Chung et al. |
| 6,936,880 B2 | 8/2005 | Park |
| 6,939,794 B2 | 9/2005 | Yin et al. |
| 6,951,822 B2 | 10/2005 | Scholz |
| 6,962,846 B2 | 11/2005 | Fishburn et al. |
| 6,991,980 B2 | 1/2006 | Park |
| 6,992,347 B2 | 1/2006 | Ema et al. |
| 7,005,379 B2 | 2/2006 | Sinha et al. |
| 7,026,208 B2 | 4/2006 | Park et al. |
| 7,037,840 B2 | 5/2006 | Katz |
| 7,042,038 B2 | 5/2006 | Yoshida et al. |
| 7,042,040 B2 | 5/2006 | Horiguchi |
| 7,053,435 B2 | 5/2006 | Yeo et al. |

(56) References Cited

U.S. PATENT DOCUMENTS

| | | | |
|---|---|---|---|
| 7,053,453 B2 | 5/2006 | Tsao et al. | |
| 7,064,028 B2 | 6/2006 | Ito et al. | |
| 7,064,365 B2 | 6/2006 | An et al. | |
| 7,064,376 B2 | 6/2006 | Shau | |
| 7,067,385 B2 | 6/2006 | Manning | |
| 7,071,055 B2 | 7/2006 | Fishburn | |
| 7,073,969 B2 | 7/2006 | Kamm | |
| 7,074,669 B2 | 7/2006 | Iijima et al. | |
| 7,078,292 B2 | 7/2006 | Park et al. | |
| 7,081,384 B2 | 7/2006 | Birner et al. | |
| 7,084,451 B2 | 8/2006 | Forbes et al. | |
| 7,087,484 B2 * | 8/2006 | Goldbach et al. | 438/243 |
| 7,094,701 B2 | 8/2006 | Umemoto et al. | |
| 7,098,105 B2 | 8/2006 | Juengling | |
| 7,115,500 B1 | 10/2006 | Torres | |
| 7,115,525 B2 | 10/2006 | Abatchev et al. | |
| 7,115,531 B2 | 10/2006 | Shaffer et al. | |
| 7,122,424 B2 | 10/2006 | Tu et al. | |
| 7,125,781 B2 | 10/2006 | Manning et al. | |
| 7,151,040 B2 | 12/2006 | Tran et al. | |
| 7,153,778 B2 | 12/2006 | Busch et al. | |
| 7,160,788 B2 | 1/2007 | Sandhu et al. | |
| 7,163,859 B2 | 1/2007 | Kim et al. | |
| 7,166,533 B2 | 1/2007 | Happ | |
| 7,179,706 B2 | 2/2007 | Patraw et al. | |
| 7,199,005 B2 | 4/2007 | Sandhu et al. | |
| 7,202,127 B2 | 4/2007 | Busch et al. | |
| 7,223,690 B2 | 5/2007 | Kondo et al. | |
| 7,226,845 B2 | 6/2007 | Manning et al. | |
| 7,230,292 B2 | 6/2007 | Graettinger | |
| 7,235,441 B2 | 6/2007 | Yasui et al. | |
| 7,235,479 B2 | 6/2007 | Verhaverbeke | |
| 7,235,485 B2 | 6/2007 | Kwak et al. | |
| 7,253,118 B2 | 8/2007 | Tran et al. | |
| 7,268,034 B2 | 9/2007 | Basceri et al. | |
| 7,268,039 B2 | 9/2007 | Fishburn et al. | |
| 7,271,051 B2 | 9/2007 | Manning et al. | |
| 7,273,779 B2 | 9/2007 | Fishburn et al. | |
| 7,279,379 B2 | 10/2007 | Tran et al. | |
| 7,282,756 B2 | 10/2007 | Agarwal et al. | |
| 7,288,806 B2 | 10/2007 | Tran et al. | |
| 7,320,911 B2 | 1/2008 | Basceri et al. | |
| 7,321,149 B2 | 1/2008 | Busch et al. | |
| 7,321,150 B2 | 1/2008 | Fishburn et al. | |
| 7,335,935 B2 | 2/2008 | Sinha et al. | |
| 7,341,909 B2 | 3/2008 | McDaniel et al. | |
| 7,384,847 B2 | 6/2008 | Tran et al. | |
| 7,387,939 B2 | 6/2008 | Manning | |
| 7,390,749 B2 | 6/2008 | Kim et al. | |
| 7,393,741 B2 | 7/2008 | Sandhu et al. | |
| 7,393,743 B2 | 7/2008 | Manning | |
| 7,396,781 B2 | 7/2008 | Wells | |
| 7,413,952 B2 | 8/2008 | Busch et al. | |
| 7,420,238 B2 | 9/2008 | Manning et al. | |
| 7,439,152 B2 | 10/2008 | Manning | |
| 7,440,255 B2 | 10/2008 | McClure et al. | |
| 7,442,600 B2 | 10/2008 | Wang et al. | |
| 7,445,990 B2 | 11/2008 | Busch et al. | |
| 7,445,991 B2 | 11/2008 | Manning | |
| 7,449,391 B2 | 11/2008 | Manning et al. | |
| 7,459,362 B2 | 12/2008 | Juengling | |
| 7,474,215 B2 | 1/2009 | Scott et al. | |
| 7,517,753 B2 | 4/2009 | Manning | |
| 7,517,754 B2 | 4/2009 | McDaniel et al. | |
| 7,521,371 B2 | 4/2009 | DeBruler | |
| 7,521,378 B2 | 4/2009 | Fucsko et al. | |
| 7,534,694 B2 | 5/2009 | Manning | |
| 7,538,036 B2 | 5/2009 | Busch et al. | |
| 7,544,563 B2 | 6/2009 | Manning | |
| 7,557,013 B2 | 7/2009 | Bhat et al. | |
| 7,557,015 B2 | 7/2009 | Sandhu et al. | |
| 7,573,088 B2 | 8/2009 | Juengling | |
| 7,576,441 B2 | 8/2009 | Yin et al. | |
| 7,629,262 B2 | 12/2009 | Kim et al. | |
| 7,634,010 B2 | 12/2009 | Soh et al. | |
| 7,638,392 B2 | 12/2009 | Wang et al. | |
| 7,655,968 B2 | 2/2010 | Manning | |
| 7,682,924 B2 | 3/2010 | Bhat et al. | |
| 7,683,413 B2 * | 3/2010 | Graettinger et al. | 257/296 |
| 7,700,469 B2 * | 4/2010 | Benson | 438/552 |
| 7,759,193 B2 | 7/2010 | Fishburn | |
| 7,785,962 B2 | 8/2010 | Bhat et al. | |
| 7,795,147 B2 | 9/2010 | Ema et al. | |
| 7,807,580 B2 | 10/2010 | Lee et al. | |
| 7,829,262 B2 | 11/2010 | Tran | |
| 7,835,442 B2 | 11/2010 | Soh et al. | |
| 7,835,443 B2 | 11/2010 | Soh et al. | |
| 7,835,444 B2 | 11/2010 | Soh et al. | |
| 7,835,445 B2 | 11/2010 | Soh et al. | |
| 7,835,446 B2 | 11/2010 | Soh et al. | |
| 7,835,447 B2 | 11/2010 | Soh et al. | |
| 7,835,448 B2 | 11/2010 | Soh et al. | |
| 7,835,449 B2 | 11/2010 | Soh et al. | |
| 7,835,450 B2 | 11/2010 | Soh et al. | |
| 7,835,451 B2 | 11/2010 | Soh et al. | |
| 7,839,934 B2 | 11/2010 | Soh et al. | |
| 7,839,935 B2 | 11/2010 | Soh et al. | |
| 7,843,999 B2 | 11/2010 | Soh et al. | |
| 7,864,049 B2 | 1/2011 | Scott et al. | |
| 7,899,116 B2 | 3/2011 | Soh et al. | |
| 7,902,081 B2 | 3/2011 | Raghu et al. | |
| 7,916,786 B2 | 3/2011 | Soh et al. | |
| 7,916,787 B2 | 3/2011 | Soh et al. | |
| 7,920,625 B2 | 4/2011 | Soh et al. | |
| 7,959,818 B2 | 6/2011 | Jung | |
| 8,105,904 B2 * | 1/2012 | Oh et al. | 438/270 |
| 8,130,842 B2 | 3/2012 | Soh et al. | |
| 8,134,823 B2 | 3/2012 | Chen et al. | |
| 8,149,919 B2 | 4/2012 | Soh et al. | |
| 8,149,921 B2 | 4/2012 | Soh et al. | |
| 8,170,114 B2 | 5/2012 | Soh et al. | |
| 8,175,166 B2 | 5/2012 | Soh et al. | |
| 8,179,975 B2 | 5/2012 | Soh et al. | |
| 8,208,546 B2 | 6/2012 | Soh et al. | |
| 8,249,156 B2 | 8/2012 | Soh et al. | |
| 8,249,157 B2 | 8/2012 | Soh et al. | |
| 8,249,163 B2 | 8/2012 | Soh et al. | |
| 8,254,452 B2 | 8/2012 | Soh et al. | |
| 8,268,695 B2 | 9/2012 | Kiehlbach et al. | |
| 8,274,777 B2 | 9/2012 | Kiehlbach | |
| 8,335,263 B2 | 12/2012 | Soh et al. | |
| 8,363,723 B2 | 1/2013 | Soh et al. | |
| 8,388,851 B2 | 3/2013 | Kiehlbach | |
| 8,404,554 B2 | 3/2013 | Ema et al. | |
| 8,426,118 B2 | 4/2013 | Tran | |
| 8,518,788 B2 | 8/2013 | Lee | |
| 8,609,324 B2 | 12/2013 | Tran | |
| 8,674,421 B2 | 3/2014 | Ema et al. | |
| 8,786,001 B2 | 7/2014 | Manning | |
| 2001/0012223 A1 | 8/2001 | Kohyama | |
| 2001/0026974 A1 | 10/2001 | Reinberg | |
| 2001/0038111 A1 | 11/2001 | DeBoer et al. | |
| 2001/0044181 A1 | 11/2001 | Nakamura | |
| 2002/0003248 A1 | 1/2002 | Ema et al. | |
| 2002/0003249 A1 | 1/2002 | Park | |
| 2002/0022339 A1 | 2/2002 | Kirchhoff | |
| 2002/0024077 A1 | 2/2002 | Ema et al. | |
| 2002/0030221 A1 | 3/2002 | Sandhu et al. | |
| 2002/0037617 A1 | 3/2002 | Kim et al. | |
| 2002/0039826 A1 | 4/2002 | Reinberg | |
| 2002/0086479 A1 | 7/2002 | Reinberg | |
| 2002/0090779 A1 | 7/2002 | Jang | |
| 2002/0098654 A1 | 7/2002 | Durcan et al. | |
| 2002/0153589 A1 | 10/2002 | Oh | |
| 2002/0153614 A1 | 10/2002 | Ema et al. | |
| 2002/0163026 A1 | 11/2002 | Park | |
| 2003/0001214 A1 | 1/2003 | Yoshida et al. | |
| 2003/0006410 A1 | 1/2003 | Doyle | |
| 2003/0085420 A1 | 5/2003 | Ito et al. | |
| 2003/0087501 A1 | 5/2003 | Park | |
| 2003/0091936 A1 | 5/2003 | Rottstegge et al. | |
| 2003/0134468 A1 | 7/2003 | Wang et al. | |
| 2003/0148581 A1 | 8/2003 | Kim et al. | |
| 2003/0153146 A1 | 8/2003 | Won et al. | |

(56) References Cited

U.S. PATENT DOCUMENTS

| | | |
|---|---|---|
| 2003/0169629 A1 | 9/2003 | Goebel et al. |
| 2003/0178684 A1 | 9/2003 | Nakamura |
| 2003/0178728 A1 | 9/2003 | Park et al. |
| 2003/0190782 A1 | 10/2003 | Ko et al. |
| 2003/0227044 A1 | 12/2003 | Park |
| 2004/0018679 A1 | 1/2004 | Yu et al. |
| 2004/0043546 A1 | 3/2004 | Yoshida et al. |
| 2004/0051127 A1 | 3/2004 | Tanaka |
| 2004/0056295 A1 | 3/2004 | Agarwal et al. |
| 2004/0110340 A1 | 6/2004 | Kim et al. |
| 2004/0150070 A1 | 8/2004 | Okada et al. |
| 2004/0173832 A1 | 9/2004 | Ema et al. |
| 2004/0175884 A1 | 9/2004 | Kang et al. |
| 2004/0175952 A1 | 9/2004 | Ema et al. |
| 2004/0188738 A1 | 9/2004 | Farnworth et al. |
| 2004/0232106 A1 | 11/2004 | Oka et al. |
| 2004/0235238 A1 | 11/2004 | Park |
| 2004/0259355 A1 | 12/2004 | Yin et al. |
| 2005/0023588 A1 | 2/2005 | Sandhu et al. |
| 2005/0048717 A1 | 3/2005 | Ito et al. |
| 2005/0051822 A1 | 3/2005 | Manning |
| 2005/0054159 A1 | 3/2005 | Manning et al. |
| 2005/0104110 A1 | 5/2005 | Yeo et al. |
| 2005/0130068 A1 | 6/2005 | Kondoh et al. |
| 2005/0158949 A1 | 7/2005 | Manning |
| 2005/0164478 A1 | 7/2005 | Chan et al. |
| 2005/0167724 A1* | 8/2005 | Choi et al. .................... 257/308 |
| 2005/0176210 A1 | 8/2005 | Kim et al. |
| 2005/0255696 A1 | 11/2005 | Makiyama et al. |
| 2005/0272220 A1 | 12/2005 | Waldfried et al. |
| 2005/0287738 A1 | 12/2005 | Cho et al. |
| 2005/0287780 A1 | 12/2005 | Manning et al. |
| 2005/0287795 A1 | 12/2005 | Torek et al. |
| 2006/0006502 A1 | 1/2006 | Yin et al. |
| 2006/0008010 A1 | 1/2006 | Soh et al. |
| 2006/0014344 A1 | 1/2006 | Manning |
| 2006/0024958 A1 | 2/2006 | Ali |
| 2006/0024966 A1 | 2/2006 | Umemoto et al. |
| 2006/0046200 A1 | 3/2006 | Abatchev et al. |
| 2006/0046420 A1 | 3/2006 | Manning |
| 2006/0046484 A1 | 3/2006 | Abatchev et al. |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0088788 A1 | 4/2006 | Kudo et al. |
| 2006/0115951 A1 | 6/2006 | Mosley |
| 2006/0115952 A1 | 6/2006 | Wu |
| 2006/0118785 A1 | 6/2006 | Allen et al. |
| 2006/0121672 A1 | 6/2006 | Basceri et al. |
| 2006/0148190 A1 | 7/2006 | Busch |
| 2006/0154182 A1 | 7/2006 | Brodsky |
| 2006/0176210 A1 | 8/2006 | Nakamura et al. |
| 2006/0186451 A1 | 8/2006 | Dusberg et al. |
| 2006/0211196 A1 | 9/2006 | Tanaka et al. |
| 2006/0211211 A1 | 9/2006 | Sandhu et al. |
| 2006/0237762 A1 | 10/2006 | Park |
| 2006/0239358 A1 | 10/2006 | Soh et al. |
| 2006/0240361 A1 | 10/2006 | Lee et al. |
| 2006/0249798 A1 | 11/2006 | Manning |
| 2006/0258109 A1 | 11/2006 | Juengling |
| 2006/0261440 A1 | 11/2006 | Manning |
| 2006/0262511 A1 | 11/2006 | Abatchev et al. |
| 2006/0263968 A1 | 11/2006 | Manning |
| 2006/0273456 A1 | 12/2006 | Sant et al. |
| 2006/0278911 A1 | 12/2006 | Eppich |
| 2006/0286783 A1 | 12/2006 | Papanu et al. |
| 2006/0286795 A1 | 12/2006 | Yosho |
| 2006/0289914 A1 | 12/2006 | Juengling |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0032014 A1 | 2/2007 | Sandhu et al. |
| 2007/0037066 A1 | 2/2007 | Hsiao |
| 2007/0045693 A1 | 3/2007 | Manning et al. |
| 2007/0045699 A1 | 3/2007 | Liao et al. |
| 2007/0045712 A1 | 3/2007 | Haller et al. |
| 2007/0045799 A1 | 3/2007 | Sekiya |
| 2007/0048674 A1 | 3/2007 | Wells |
| 2007/0048930 A1 | 3/2007 | Figura et al. |
| 2007/0048976 A1 | 3/2007 | Raghu |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0057304 A1 | 3/2007 | Boescke et al. |
| 2007/0066010 A1 | 3/2007 | Ando |
| 2007/0069271 A1 | 3/2007 | Kim et al. |
| 2007/0077743 A1 | 4/2007 | Rao et al. |
| 2007/0085152 A1 | 4/2007 | Butler et al. |
| 2007/0093022 A1 | 4/2007 | Basceri |
| 2007/0096182 A1 | 5/2007 | Schloesser et al. |
| 2007/0099328 A1 | 5/2007 | Chiang et al. |
| 2007/0099423 A1 | 5/2007 | Chen et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145009 A1 | 6/2007 | Fucsko et al. |
| 2007/0145464 A1 | 6/2007 | Voshell et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0196978 A1 | 8/2007 | Manning |
| 2007/0197014 A1 | 8/2007 | Jeon et al. |
| 2007/0202671 A1 | 8/2007 | Jung |
| 2007/0202686 A1 | 8/2007 | Dixit et al. |
| 2007/0202697 A1 | 8/2007 | Jung |
| 2007/0205438 A1 | 9/2007 | Juengling |
| 2007/0205443 A1 | 9/2007 | Juengling |
| 2007/0207622 A1 | 9/2007 | Rana et al. |
| 2007/0224537 A1 | 9/2007 | Nozaki et al. |
| 2007/0238259 A1 | 10/2007 | Bhat |
| 2007/0248919 A1 | 10/2007 | Shirasaki |
| 2007/0257323 A1 | 11/2007 | Tsui et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0009135 A1 | 1/2008 | Ema et al. |
| 2008/0026327 A1 | 1/2008 | Koo |
| 2008/0032243 A1 | 2/2008 | Jung |
| 2008/0032508 A1 | 2/2008 | Chang |
| 2008/0037653 A1 | 2/2008 | Soh et al. |
| 2008/0037654 A1 | 2/2008 | Soh et al. |
| 2008/0037655 A1 | 2/2008 | Soh et al. |
| 2008/0044770 A1 | 2/2008 | Nozaki et al. |
| 2008/0057692 A1 | 3/2008 | Wells et al. |
| 2008/0064213 A1 | 3/2008 | Jung |
| 2008/0070165 A1 | 3/2008 | Fischer et al. |
| 2008/0090416 A1 | 4/2008 | Raghu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171137 A1 | 7/2008 | Kim et al. |
| 2008/0171438 A1 | 7/2008 | Sinha et al. |
| 2008/0171446 A1 | 7/2008 | Kim et al. |
| 2008/0174430 A1 | 7/2008 | Scott et al. |
| 2008/0176406 A1 | 7/2008 | Ikeda et al. |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0261349 A1 | 10/2008 | Abatchev et al. |
| 2008/0287795 A1 | 11/2008 | Klingensmith et al. |
| 2008/0296732 A1 | 12/2008 | Olson |
| 2008/0305636 A1 | 12/2008 | Kim et al. |
| 2009/0047769 A1 | 2/2009 | Bhat et al. |
| 2009/0110064 A1 | 4/2009 | Soh et al. |

(56) References Cited

U.S. PATENT DOCUMENTS

| | | |
|---|---|---|
| 2009/0110080 A1 | 4/2009 | Soh et al. |
| 2009/0115612 A1 | 5/2009 | Scott et al. |
| 2009/0116553 A1 | 5/2009 | Soh et al. |
| 2009/0116559 A1 | 5/2009 | Soh et al. |
| 2009/0116560 A1 | 5/2009 | Soh et al. |
| 2009/0122871 A1 | 5/2009 | Soh et al. |
| 2009/0128689 A1 | 5/2009 | Soh et al. |
| 2009/0129462 A1 | 5/2009 | Soh et al. |
| 2009/0129463 A1 | 5/2009 | Soh et al. |
| 2009/0129475 A1 | 5/2009 | Soh et al. |
| 2009/0129480 A1 | 5/2009 | Soh et al. |
| 2009/0129482 A1 | 5/2009 | Soh et al. |
| 2009/0135899 A1 | 5/2009 | Soh et al. |
| 2009/0135900 A1 | 5/2009 | Soh et al. |
| 2009/0147858 A1 | 6/2009 | Soh et al. |
| 2009/0175337 A1 | 7/2009 | Soh et al. |
| 2009/0175339 A1 | 7/2009 | Soh et al. |
| 2009/0175340 A1 | 7/2009 | Soh et al. |
| 2009/0175341 A1 | 7/2009 | Soh et al. |
| 2009/0175346 A1 | 7/2009 | Soh et al. |
| 2009/0175347 A1 | 7/2009 | Soh et al. |
| 2009/0175351 A1 | 7/2009 | Soh et al. |
| 2009/0175352 A1 | 7/2009 | Soh et al. |
| 2009/0175354 A1 | 7/2009 | Soh et al. |
| 2009/0175549 A1 | 7/2009 | Soh et al. |
| 2009/0176011 A1 | 7/2009 | Kiehlbauch |
| 2009/0180540 A1 | 7/2009 | Soh et al. |
| 2009/0212016 A1 | 8/2009 | Cheng et al. |
| 2009/0251845 A1 | 10/2009 | Kiehlbauch |
| 2009/0291397 A1 | 11/2009 | deVilliers |
| 2010/0009512 A1 | 1/2010 | Fishburn |
| 2010/0041204 A1 | 2/2010 | Kiehlbauch et al. |
| 2010/0112798 A1 | 5/2010 | Lai et al. |
| 2010/0117196 A1 | 5/2010 | Manning |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0283092 A1 | 11/2010 | Ema et al. |
| 2010/0285653 A1 | 11/2010 | Ema et al. |
| 2011/0014574 A1 | 1/2011 | Tran |
| 2011/0151655 A1 | 6/2011 | Chan et al. |
| 2011/0183522 A1 | 7/2011 | Mikhaylichenko et al. |
| 2011/0227167 A1 | 9/2011 | Chuang et al. |
| 2012/0012922 A1 | 1/2012 | Jang |
| 2012/0040507 A1 | 2/2012 | Lee |
| 2013/0008000 A1 | 1/2013 | Kiehlbach |
| 2013/0164902 A1 | 6/2013 | Greeley et al. |
| 2013/0210228 A1 | 8/2013 | Tran |

FOREIGN PATENT DOCUMENTS

| | | |
|---|---|---|
| CN | 101154620 | 4/2008 |
| CN | 101208775 | 6/2008 |
| CN | 200980126565.1 | 1/2013 |
| DE | 4447804 | 1/2002 |
| EP | 0171111 | 2/1986 |
| EP | 09794877 | 10/2012 |
| JP | 56-046531 | 4/1981 |
| JP | 58-157135 | 9/1983 |
| JP | 59-211231 | 11/1984 |
| JP | 2004-155810 | 5/1992 |
| JP | 1996-274278 | 10/1996 |
| JP | 1998-189912 | 7/1998 |
| JP | 11-026719 | 1/1999 |
| JP | 1999-191615 | 7/1999 |
| JP | 2000-196038 | 7/2000 |
| JP | 2001-189438 | 7/2001 |
| JP | 2003-142605 | 5/2003 |
| JP | 2003-234279 | 8/2003 |
| JP | 2003-264246 | 9/2003 |
| JP | 2003-273247 | 9/2003 |
| JP | 2003-297952 | 10/2003 |
| JP | 2004-072078 | 3/2004 |
| JP | 2004-111626 | 4/2004 |
| JP | 2004-128463 | 4/2004 |
| JP | 2004-247399 | 9/2004 |
| JP | 2004-032982 | 2/2005 |
| JP | 2006-032695 | 2/2006 |
| JP | 2006-135364 | 5/2006 |
| JP | 2006-245625 | 9/2006 |
| JP | 2008-072101 | 3/2008 |
| KR | 20010061020 | 7/2001 |
| KR | 2001-0114003 | 12/2001 |
| KR | 102001108963 | 12/2001 |
| KR | 2003-0049196 | 6/2003 |
| KR | 2003-0056601 | 7/2003 |
| KR | 1020030058018 | 7/2003 |
| KR | 2003-0089063 | 11/2003 |
| KR | 4025289 | 3/2004 |
| KR | 2004-0057582 | 7/2004 |
| KR | 1020050000896 | 1/2005 |
| KR | 10-520223 | 10/2005 |
| KR | 10-2007-0076793 | 7/2007 |
| KR | 10-2007-0122049 | 12/2007 |
| KR | 10-0784062 | 12/2007 |
| KR | 10-2008-0039006 | 5/2008 |
| TW | 513801 | 12/2002 |
| TW | I252511 | 4/2006 |
| TW | I307160 | 3/2009 |
| TW | 097129916 | 5/2012 |
| TW | 098121062 | 8/2012 |
| WO | PCT/US2004/027898 | 2/2005 |
| WO | WO 2005/024936 | 3/2005 |
| WO | PCT/US2004/040252 | 5/2005 |
| WO | WO 2005/062349 | 7/2005 |
| WO | PCT/US2006/006806 | 2/2006 |
| WO | PCT/US2006/006806 | 7/2006 |
| WO | PCT/US2004/027898 | 9/2006 |
| WO | PCT/US2006/006806 | 3/2007 |
| WO | WO 2007/027558 | 3/2007 |
| WO | PCT/US2007/015729 | 1/2008 |
| WO | PCT/US2007/015729 | 1/2009 |
| WO | PCT/US2008/070071 | 7/2009 |
| WO | PCT/US2009/039793 | 10/2009 |
| WO | PCT/US2009/041500 | 12/2009 |
| WO | PCT/US2009/046946 | 1/2010 |
| WO | PCT/US2009/063978 | 5/2010 |
| WO | PCT/US2009/063999 | 5/2010 |
| WO | PCT/US2009/064004 | 5/2010 |
| WO | PCT/US2010/025495 | 9/2010 |
| WO | PCT/US2009/039793 | 11/2010 |
| WO | PCT/US2009/041500 | 11/2010 |
| WO | PCT/US2004/040252 | 12/2010 |
| WO | PCT/US2009/046946 | 1/2011 |
| WO | PCT/US2009/063978 | 6/2011 |
| WO | PCT/US2009/063999 | 6/2011 |
| WO | PCT/US2009/064004 | 6/2011 |
| WO | PCT/US2010/025495 | 9/2011 |

OTHER PUBLICATIONS

"Conductive Polymer" Wikipedia http://en/wikipedia.org/w/index.php?title=Conductive_polymer&printable=yes.

Banhart., "Aluminum Foams: on the road to real applications", MRS Bulletin, Apr. 2003, pp. 290-295.

Crouse et al., "Self-Assembled Nanostructures Using Anodized Alunmina Thin Films for Optoelectronic applications", IEEE, pp. 234-235, 1999.

Gibson et al., "Cellular Solids", MRS Bulletin, Apr. 2003, pp. 270-274.

Green et al., "Cellular Ceramics: Intriguing Structures, Novel Properties, and Innovative Applications", MRS Bulletin, Apr. 2003, pp. 296-300.

Green et al., "The Structure and Applications of Cellular Ceramics", MRS Bulletin, Apr. 2003, 10 pages.

Karp et al., "Scaffolds for Tissue Engineering", MRS Bulletin, Apr. 2003, pp. 301-302.

Kim et al., "A mechanically enhanced storage node for virtually unlimited height (MESH) capacitor aiming at sub 70nm DRAMs", IEEE, Jan. 2004, pp. 69-72.

(56) References Cited

OTHER PUBLICATIONS

Konovalov et al., "Chemistry of Materials", Chem. Mater., vol. 11, No. 8, pp. 1949-1951 (Aug. 1999).

Kraynik, "Foam Structure: From Soap Froth to Solid Foams", MRS Bulletin, Apr. 2003, pp. 275-278.

Li., "Metal-assisted chemical etching in HF/H2O2 produces porous silicon", Applied Physics Letters, vol. 77, No. 16, Oct. 16, 20000, pp. 2572-2574.

Liang et al., "Nonlithographic Fabrication of Lateral Superlattices for Nanometric Electromagnetic-Optic . . .", IEEE J. Selected Topics in Quantum Electr., vol. 8, No. 5, pp. 998-1008 (Sep./Oct. 2002).

Liu et al., "Ordered anodic alumina nanochannels on focused-ion-beam-prepatterned aluminum surfaces", appl. Phys. Lett. vol. 78, No. 1, pp. 120-122 (Jan. 2001).

Maire et al., "In Situ X-Ray tomography Measurements of Deformatio in Sellular Solids", MRS Bulletin, Apr. 2003, pp. 284-289.

Masuda et al., "Highly ordered nanochannel-array architecture in anodic alumina", App. Phys. Lett, vol. 71, No. 19, Nov. 1997, pp. 2770-2772.

Nadeem et al., "Fabrication of Microstructures Using Aluminum Anodization Techniques", pre-2004, pp. 274-277.

Oh et al., "Preparation and Pore-Characteristics Control of Nano-Porous Materials Using Organometallic Building Blocks", Carbon Science, vol. 4, No. 1, Mar. 2003, pp. 1-9.

Onch, "Scale Effects in Cellular Metals", MRS Bulletin, Apr. 2003, pp. 279-283.

O'Sullivan et al., "The Morphology and Mechanism of Formation of Porous Anodic Films on Aluminum", Proc. Roy. Soc. Lond. A, vol. 317, 1970, pp. 511-543.

Park et al., "Block Copolymer Lithography: Periodic Arrays of ~1011 Holes in 1 Square Centimeter", Science, vol. 276, May 1997, pp. 1401-1404.

Park et al., "Novel Robust Cell Capacitor (Leaning Exterminated Ring Type Insulator) and New Storage Node Contact", IEEE, 2004 Symposium on VLSI Technology Digest of Technical Papers, pp. 34-35.

Shingubara, "Fabrication of nanomaterials using porous aluina templates", J. Nanoparticle Res., vol. 5, 2003, pp. 17-30.

Tan et al., "High Aspect Ratio Microstructures on Porous Anodic Aluminum Oxide", IEEE, 1995, pp. 267-272.

Tsukada et al., "Preparation and Application of Porous Silk Fibroin Materials", J. Appl. Polymer Sci., vol. 54, 1994, pp. 507-514.

Yasaitis et al., "A modular process for integrating thick polysilicon MEMS devices with submicron CMOS", Analog Devices, Pre-2004.

J Robertson, Diamond-like amorphous carbon, Material Science and Engineering R 37 (2002) 129-281.

John Robertson, Hard Amorphous (Diamond-Like) Carbons, Prog Solid St Chem. vol. 21, pp. 199-333, (1991).

Terai et al. "Newly developed RELACS process and materials for 65nm node device and beyond", website: ieeexplore.ieee.org/iel5/10631/33565/01595193.pdf, pp. 20-21.

Clarlant, "Polysilazane SODs Spinfil™ 400 Series for STI/PDM Application", Product Description, Oct. 19, 2009, Japan, 1 page.

Ee et al. "Innovative Solutions to Enhance the Legacy Equipments Towards 'One Generation Ahead' in Flip Chip BGA 0.8mm Ball Pitch Technology", IEEE 2005, United States, pp. 331-334.

Fritze et al., "Enhanced Resolution for Future Fabrication", IEEE Circuits and Devices Magazine, Jan. 2003, United States, pp. 43-47.

Gallia et al., :A Flexible Gate Array Architecture for High-Speed and High-Density Applications, IEEE Journal of Solid-State Circuits vol. 31, Mar. 1996, United States, pp. 430-436.

Hori et al., "Sub-40nm Half-Pitch Double Patterning with Resist Freezing Process", Proceedings of SPIE vol. 6923, 2009, United States, 8 pages.

Lee et al., "Double-Patterning Technique Using Plasma Treatment of Photoresist", Japanese Journal of Applied Physics vol. 46, No. 9B, 2007, Japan, pp. 6135-6139.

Liau et al., "Softbake and Post-Exposure Bake Optimization for Process Window Improvement and Optical Proximity Effect Tuning", ICSE Proceedings 2006, Kuala Lumpur, Malaysia, 7 pages.

Lu, "Advanced Cell Structures for Dynamic RAMs", IEEE Cirsuits and Devices and Magazine, Jan. 1989, United States, pp. 27-36.

Ma, "Plasma Resist Image Stabilization Technique (PRIST)", IEEE, 1980, United States, pp. 574-575.

Owa et al. "Immersion Lithography Ready for 45 nm Manufacturing and Beyond", IEEE/SEMI Advances Semiconductor Manufacturing Conference, 2007, United States, pp. 238-244.

Pease et al., "Lithography and Other Patterning Techniques for Future Electronics", Proceedings of the IEEE vol. 96, No. 2, Feb. 2008, United States, pp. 248-270.

Tan et al., "Current Status of Nanonex Nanoimprint Solutions", online: www.nanonex.com/documents/PDF_007.pdf and www.nanonex.com/technology.htm, 2004, 9 pages.

\* cited by examiner

INTEGRATED CIRCUITRY, METHODS OF FORMING CAPACITORS, AND METHODS OF FORMING INTEGRATED CIRCUITRY COMPRISING AN ARRAY OF CAPACITORS AND CIRCUITRY PERIPHERAL TO THE ARRAY

TECHNICAL FIELD

Embodiments disclosed herein pertain to integrated circuitry, and to methods of forming capacitors including methods of forming integrated circuitry comprising an array of capacitors and circuitry peripheral to the array.

BACKGROUND

Capacitors are one type of component used in the fabrication of integrated circuits, for example in DRAM and other memory circuitry. A capacitor is comprised of two conductive electrodes separated by a non-conducting dielectric region. As integrated circuitry density has increased, there is a continuing challenge to maintain sufficiently high storage capacitance despite decreasing capacitor area. The increase in density has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage electrode is formed. For example, an array of capacitor electrode openings for individual capacitors may be fabricated in an insulative support material, with an example material being silicon dioxide doped with one or both of phosphorus and boron. Openings within which some or all of the capacitors are formed are etched into the support material. It can be difficult to etch such openings through the support material, particularly where the openings are deep.

Further and regardless, it is often desirable to etch away most if not all of the capacitor electrode support material after individual capacitor electrodes have been formed within the openings. Such enables outer sidewall surfaces of the electrodes to provide increased area and thereby increased capacitance for the capacitors being formed. However, capacitor electrodes formed in deep openings are often correspondingly much taller than they are wide. This can lead to toppling of the capacitor electrodes, either during etching to expose the outer sidewalls surfaces, during transport of the substrate, and during deposition of the capacitor dielectric layer and/or outer capacitor electrode layer. U.S. Pat. No. 6,667,502 teaches the provision of a brace or retaining structure intended to alleviate such toppling. Other aspects associated in the formation of a plurality of capacitors, some of which include bracing structures, are also disclosed and are:

U.S. Pat. No. 7,067,385;
U.S. Pat. No. 7,125,781;
U.S. Pat. No. 7,199,005;
U.S. Pat. No. 7,202,127;
U.S. Pat. No. 7,387,939;
U.S. Pat. No. 7,439,152;
U.S. Pat. No. 7,517,753;
U.S. Pat. No. 7,544,563;
U.S. Pat. No. 7,557,013;
U.S. Pat. No. 7,557,015;
U.S. Patent Publication No. 2008/0090416;
U.S. Patent Publication No. 2008/0206950;
U.S. Pat. No. 7,320,911;
U.S. Pat. No. 7,682,924; and
U.S. Patent Publication No. 2010/0009512.

Fabrication of capacitors in memory circuitry may include forming an array of capacitors within a capacitor array area. Control or other circuitry area is often displaced from the capacitor array area, and the substrate may include an intervening area between the capacitor array area and the control or other circuitry area.

DETAILED DESCRIPTION OF EXAMPLE EMBODIMENTS

Figure 1:
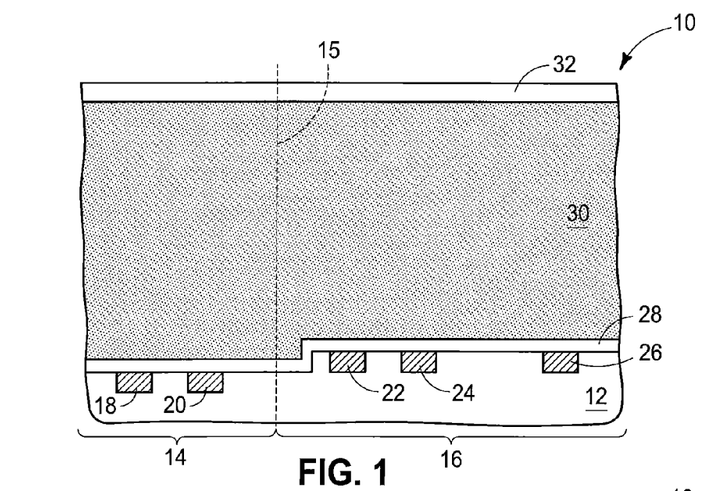
FIG. 1 is a diagrammatic, cross-sectional view of a portion of a semiconductor substrate at a preliminary processing stage of an embodiment in accordance with the invention.
Figure 2:
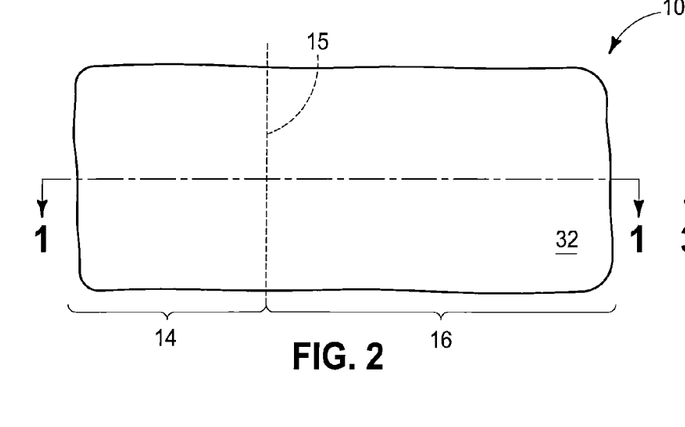
FIG. 2 is a diagrammatic top view of a portion of the semiconductor substrate comprising the cross-section shown in FIG. 1 along the line 1-1.

Some embodiments include methods of forming integrated circuitry comprising an array of capacitors and circuitry peripheral to the array. Some embodiments include methods of forming capacitors regardless of fabrication of integrated circuitry comprising both array and peripheral areas. Example methods of forming capacitors in accordance with embodiments of the invention are described with reference to FIGS. 1-12. Referring initially to FIGS. 1 and 2, a construction 10 is shown at a preliminary processing stage of an embodiment. Construction 10 includes a substrate 12 which may comprise semiconductive material. To aid in interpretation of the claims that follow, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 may comprise a capacitor array area 14 and a peripheral circuitry area 16. An example interface line 15 has been used in the drawings to define an interface of capacitor array area 14 and peripheral circuitry area 16. Logic circuitry may be fabricated within peripheral circuitry area 16. Control and/or other peripheral circuitry for operating a memory array may or may not be fully or partially within array area 14, with an example memory array area 14 as a minimum encompassing all of the memory cells of a given memory array/sub-memory array. Further, multiple sub-arrays might also be fabricated and operated independently, in tandem, or otherwise relative one another. As used herein, a "sub-array" or "sub-memory array" may be considered as an array. Various circuit devices (not shown) could be associated with peripheral circuitry area 16, as well as with capacitor array area 14, at the processing stage of FIGS. 1 and 2.

Electrically conductive node locations 18, 20 are shown within memory array area 14, and electrically conductive node locations 22, 24, 26 are shown within peripheral circuitry area 16. Node locations 18, 20, 22, 24, 26 may correspond to, for example, conductively-doped diffusion regions within a semiconductive material of substrate 12, and/or to conductive pedestals associated with substrate 12. Although the node locations are shown to be electrically conductive at the processing stage of FIG. 1, the electrically conductive materials of the node locations could be provided at a processing stage subsequent to that of FIG. 1 (not shown). The node locations may ultimately be electrically connected with transistor or other constructions (not shown), and can correspond to source/drain regions of transistor constructions, or can be ohmically connected to source/drain regions of transistor constructions. As an alternate example, the node locations may correspond to, connect to, or be parts of conductive interconnect lines.

Construction 10 may comprise dielectric material 28 elevationally over (i.e., atop) substrate 12 and/or node locations 18, 20, 22, 24, 26. Dielectric material 28 may be homogenous or non-homogenous, with silicon dioxide and silicon nitride being examples. An example thickness range for dielectric material 28 is from about 50 Angstroms to about 300 Angstroms.

A support material 30 is provided elevationally over substrate 12 within capacitor array area 14 and peripheral circuitry area 18. In one embodiment where dielectric material 28 is provided, support material 30 may be provided directly against dielectric material 28. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another. Regardless, support material 30 is at least one of semiconductive or conductive, and may be homogenous or non-homogenous. For example, support material 30 may be a single homogenous layer of a conductive or semiconductive material, multiple layers of a single homogenous semiconductive or conductive material, or multiple layers of differing compositions of semiconductive and/or conductive materials. An example support material comprises silicon, for example amorphous, monocrystalline, and/or polycrystalline silicon whether doped or undoped. One particular ideal material is polycrystalline silicon which is either undoped to possess semiconductor properties, or lightly doped to possess semiconductor properties. As an alternate example, a polycrystalline silicon support material 30 may be heavily doped sufficiently to be electrically conductive. Additional example conductive materials include gallium nitride and carbon whether alone or in combination. An example thickness range for support material 30 is from about 2,500 Angstroms to about 3 microns.

A dielectric material 32 may be provided elevationally outward of (i.e. atop) semiconductive and/or conductive support material 30, and if provided may be directly against support material 30. Dielectric material 32 may be of the same composition or of different compositions from that of dielectric material 28. Dielectric material 32 may provide a chemical mechanical polishing stop, etch stop, and/or other function. An example thickness for dielectric material 32 is from about 600 Angstroms to about 1,500 Angstroms.

Figure 3:
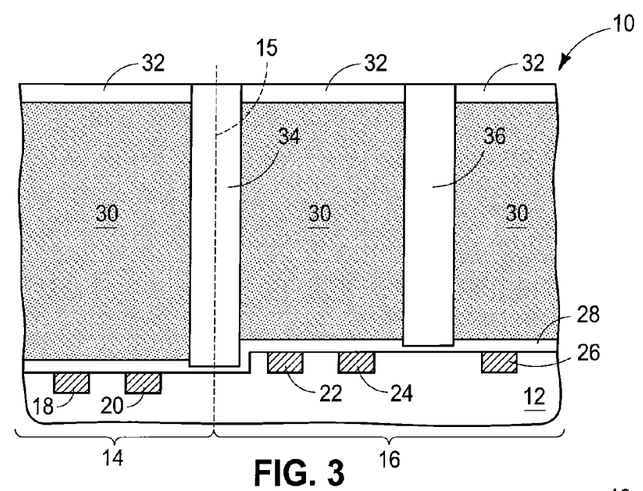
FIG. 3 is a diagrammatic, cross-sectional view of the FIG. 1 substrate at a processing stage subsequent to that of FIG. 1.
Figure 4:
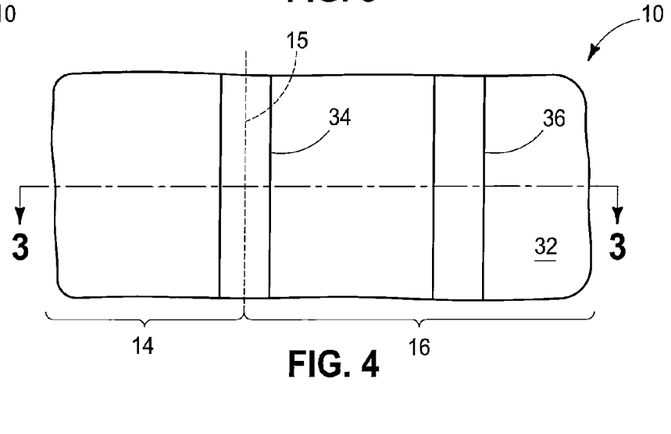
FIG. 4 is a diagrammatic top view of the FIG. 3 substrate comprising the cross-section shown in FIG. 3 along the line 3-3.

Referring to FIGS. 3 and 4, and in one embodiment, dielectric isolation 34 has been formed elevationally through (i.e., through the elevational thickness of) support material 30 to laterally separate capacitor array area 14 and peripheral circuitry area 16 from one another. In one embodiment and as shown, dielectric isolation 36 has also been formed elevationally through support material 30 within peripheral circuitry area 16. Dielectric isolation 34 and/or 36 when used may be formed at other times in the process, and regardless of when formed may be formed at the same time or at different times. Dielectric isolation 34, 36 may be of the same composition or of different compositions relative one another, may each be homogenous or non-homogenous, and may each be of the same composition or of different compositions from that of dielectric materials 28 and/or 32. An example technique for forming dielectric isolation 34 and/or 36 includes photolithographic patterning and etch through materials 32 and 30, and at least into dielectric material 28. Dielectric material 34 and/or 36 may then be deposited sufficiently to overfill the openings, followed by planarization back at least to the outermost surface of dielectric material 32 as shown. Where support material 30 is doped or undoped polysilicon, an example etching chemistry for anisotropically etching openings therein as shown includes $NF_3:O_2:HBr$ at a volumetric ratio of 1:1:3 to 5. Alternate examples include substituting $SF_6$ or $Cl_2$ for the $NF_3$ and in such events providing an alternate volumetric ratio of 1:1:1.

Figure 5:
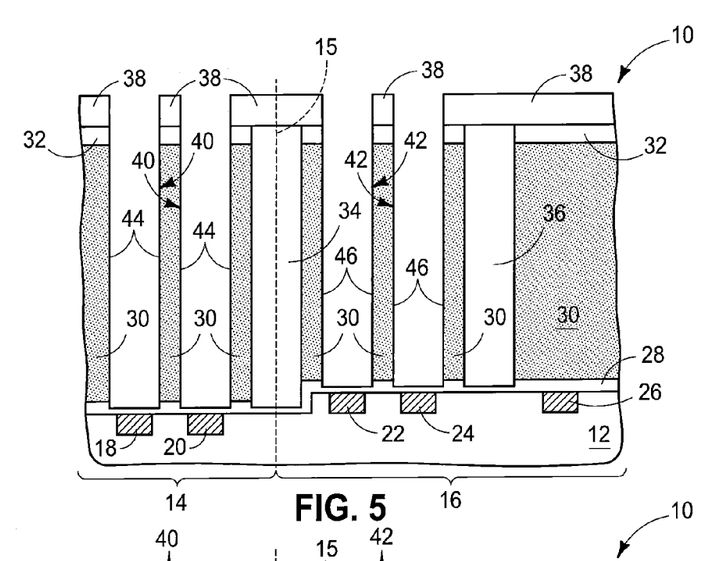
FIG. 5 is a diagrammatic, cross-sectional view of the FIG. 3 substrate at a processing stage subsequent to that of FIG. 3.
Figure 6:
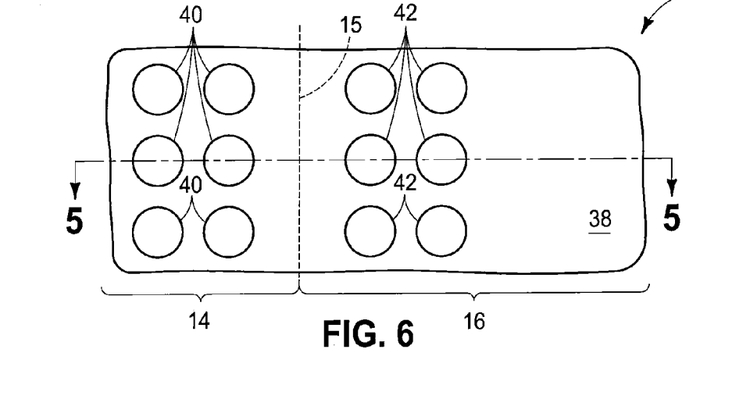
FIG. 6 is a diagrammatic top view of the FIG. 5 substrate comprising the cross-section shown in FIG. 5 along the line 5-5.

Referring to FIGS. 5 and 6, capacitor openings 40 have been formed into support material 30 within capacitor array area 14 and antifuse openings 42 have been formed into support material 30 within peripheral circuitry area 16. In one embodiment, capacitor openings 40 and/or antifuse openings 42 are formed completely through support material 30, as shown. An example technique for forming openings 40 and 42 includes photolithographic, or other masking, and etch of support material 30. For example, FIGS. 5 and 6 show a patterned hardmask 38 formed over support material 30. Openings have been etched through patterned mask 38 first through insulator material 32, with capacitor openings 40 and antifuse openings 42 within support material 30 then being formed. Etching may continue into dielectric material 28 to form openings either partially (as shown) or fully (not shown) therein or there-through. The openings that are formed in dielectric material 32 and 28 may align with openings 40, 42 in support material 30.

When both of capacitor openings 40 and antifuse openings 42 are ultimately formed, such may be formed in the same masking step (as shown) or in different masking steps. Regardless, capacitor openings 40 have at least one of semiconductive or conductive sidewalls 44, and antifuse openings 42 have at least one of semiconductive or conductive sidewalls 46. Sidewalls 44 and 46 may comprise both a semiconductive portion and a conductive portion where, for example, support material 30 comprises a semiconductive portion elevationally inward (i.e., downward on the plane of the page upon which FIG. 5 lies) or elevationally outward (i.e., upward on the plane of the page upon which FIG. 5 lies) relative to a conductive portion. Alternately by way of example, sidewalls 44, 46 may be semiconductive if support material 30 along where the sidewalls are formed is only of one or more semiconductive materials or conductive if only of one or more conductive materials. Regardless, FIGS. 3-6 depict but one example embodiment wherein dielectric isolation 34, 36 has been formed before forming openings 40, 42, although isolation 34 and/or 36 could be formed later in the process.

Figure 7:
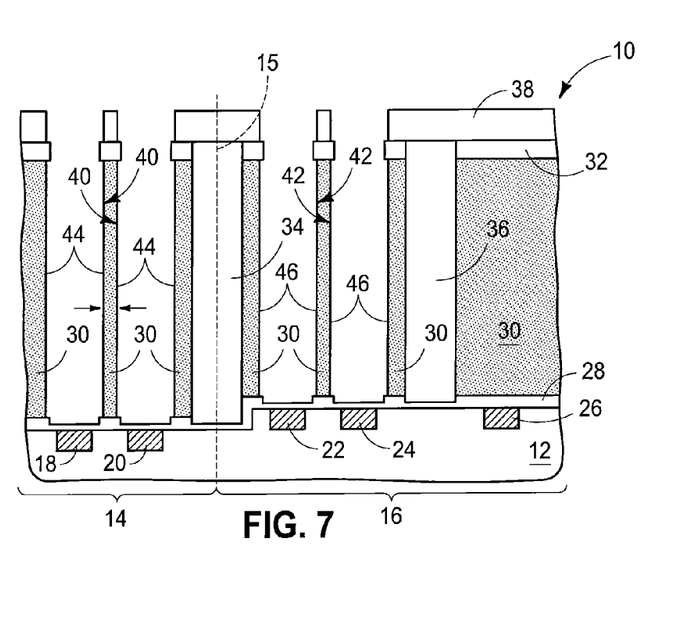
FIG. 7 is a diagrammatic, cross-sectional view of the FIG. 5 substrate at a processing stage subsequent to that of FIG. 5.

Referring to FIG. 7, capacitor openings 40 within support material 30 and antifuse openings 42 within support material 30 have been laterally widened. Such may occur by any suitable method, for example by an isotropic etch which may be substantially selective to etch material 30 greater than any etching of material(s) 32 and/or 28. Where, for example, support material 30 comprises doped or undoped polysilicon and dielectric material(s) 28 and/or 32 comprise(s) silicon dioxide and/or silicon nitride, an aqueous HF solution may be used to isotropically etch material 30 as shown. Aqueous HF may also remove any native oxide that may be received over sidewalls 44 and/or 46. Such a solution may alternately, by way of example, be used to remove any such native oxide without appreciably etching support material 30 if conducted quickly enough. Regardless, in one embodiment, FIGS. 5 and 6 depict an example wherein first openings have been formed into support material, followed by laterally widening the first openings into wider second openings (FIG. 7). In one embodiment, the first openings may be formed by anisotropically etching of the support material and the laterally widening may be by isotropically etching the support material.

Figure 8:
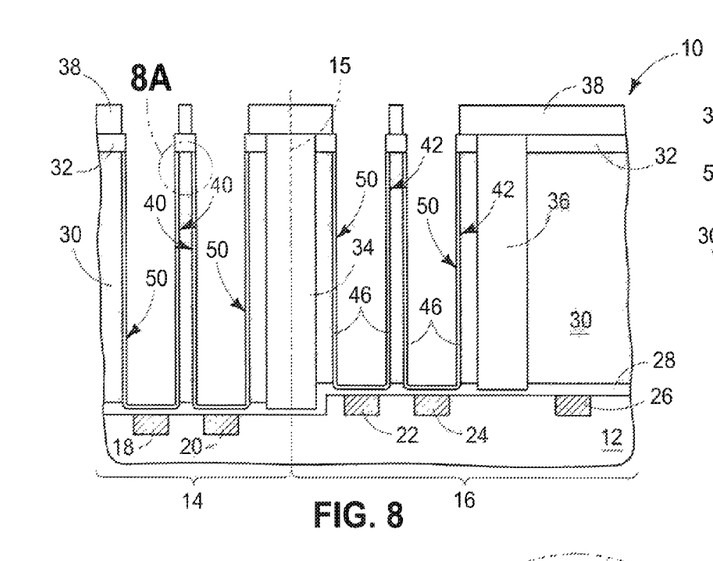
FIG. 8 is a diagrammatic, cross-sectional view of the FIG. 7 substrate at a processing stage subsequent to that of FIG. 7.
Figure 8A:
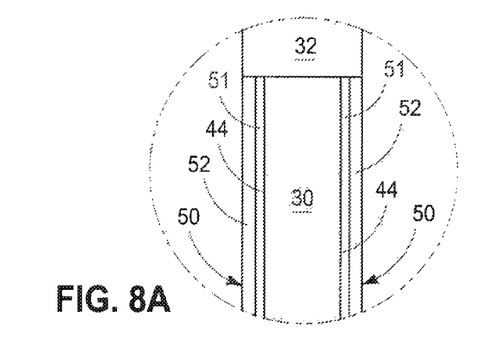
FIG. 8A is an enlarged view of a portion of FIG. 8 showing the section shown in circle 8A in FIG. 8.

Referring to FIGS. 8 and 8A, an insulator 50 has been deposited along semiconductive and/or conductive capacitor opening sidewalls 44. Additionally, an insulator 50 has been deposited along semiconductive and/or conductive antifuse opening sidewalls 46. The insulators along sidewalls 44 and 46 may be of the same composition or of different compositions. Further and regardless, insulator 50 deposited along antifuse opening sidewalls 46 may be deposited while depositing insulator 50 along capacitor opening sidewalls 44. Insulator 50 may be formed directly against support material sidewalls 44 and/or 46.

Insulator 50 may be homogenous or non-homogenous, with an example thickness being from about 10 Angstroms to about 75 Angstroms. In the depicted example, insulator 50 is shown as comprising an insulative material 51 and an insulative material 52 (FIG. 8A). Materials 51 and 52 may be homogenous or non-homogenous, and may also be formed over dielectric material 28 at the base of capacitor openings 40 and antifuse openings 42 (as shown) and/or over sidewalls and tops of materials 32 and/or 38 (not shown). Regardless, in one embodiment, insulator 50 may be deposited by thermally oxidizing support material 30 of sidewalls 44 and 46. In one embodiment, depositing insulator 50 may comprise at least one of chemical vapor depositing or atomic layer depositing the insulator along sidewalls 44, 46. In one embodiment, insulative material 51 may be formed by thermally oxidizing the support material opening sidewalls 44, 46 followed by chemical vapor depositing and/or atomic layer depositing insulative material 52 laterally thereover. Where, for example, support material 30 comprises polysilicon, insulative material 50 may be thermally oxidized to form $SiO_2$ in an ozone or other oxygen-containing ambient. An example ideal insulative material 52 is $Al_2O_3$. Regardless, an example lateral thickness for each of insulative materials 51 and 52 is from about 10 Angstroms to about 40 Angstroms. In one embodiment and as shown, insulative material 52 is thicker than insulative material 51. Additionally, more than two insulative material layers not shown) may be used.

Figure 9:
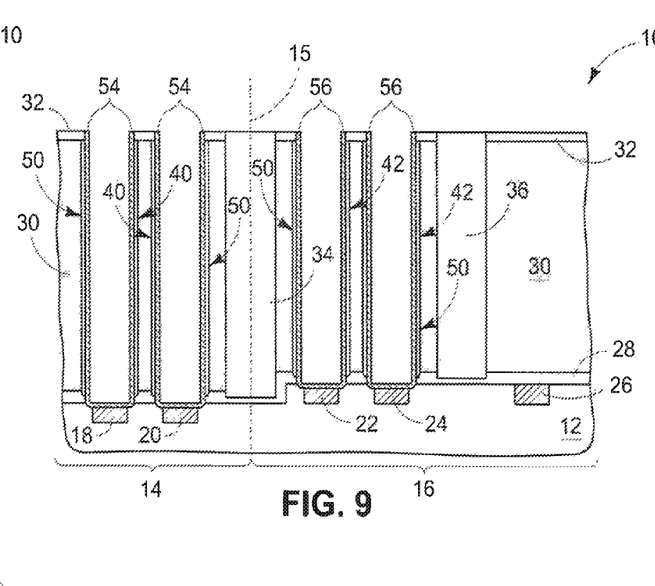
FIG. 9 is a diagrammatic, cross-sectional view of the FIG. 8 substrate at a processing stage subsequent to that of FIG. 8.

A pair of capacitor electrodes having a capacitor dielectric there-between is formed within the capacitor openings laterally of the deposited insulator. A pair of antifuse electrodes having insulative material there-between is formed within the respective antifuse openings laterally of the deposited insulator in the antifuse openings. Such capacitors and antifuses may be formed at the same time or at different times. FIG. 9 depicts an example embodiment wherein hard-mask material 38 (not shown) has been removed as have materials 50 and 28 that are over conductive node locations 18, 20, 22, and 24. Conductive material has then been deposited and planarized back to form elevationally inner capacitor electrodes 54 (e.g., first capacitor electrodes) and elevationally inner antifuse electrodes 56 (e.g., first antifuse electrodes) within openings 40 and 42, respectively. In one embodiment, the depicted electrodes 54 and/or 56 have upwardly open container-like shapes. An example conductive material is one or both of titanium and titanium nitride to provide at least electrodes 54 to have a minimum thickness, in one embodiment, of from about 20 Angstroms to about 50 Angstroms.

Figure 10:
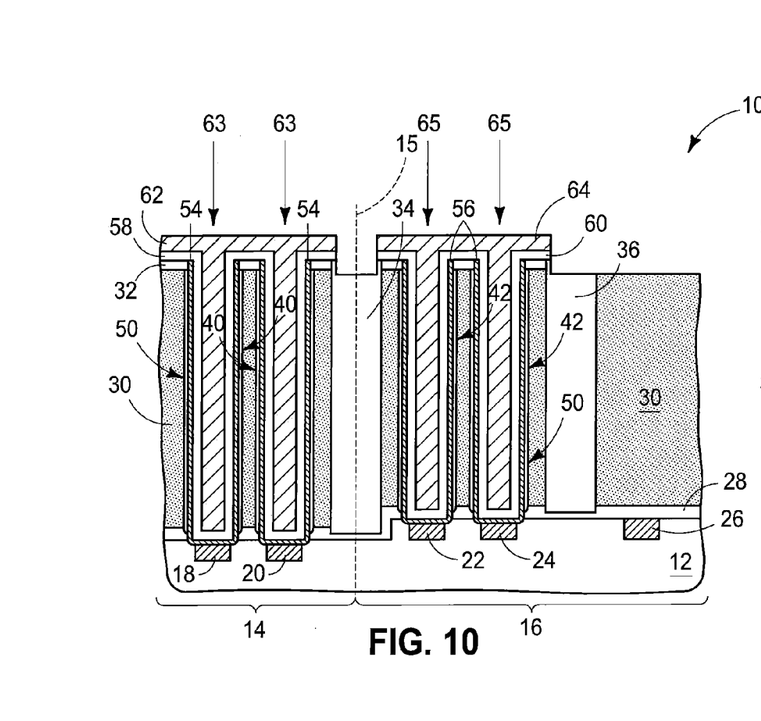
FIG. 10 is a diagrammatic, cross-sectional view of the FIG. 9 substrate at a processing stage subsequent to that of FIG. 9.

Referring to FIG. 10, an elevationally outer capacitor electrode 62 (e.g., a second capacitor electrode) and capacitor dielectric 58 have been formed over inner capacitor electrodes 54. An elevationally outer antifuse electrode 64 (e.g., a second antifuse electrode) and insulative material 60 have been formed over inner antifuse electrodes 56. Capacitors 63 and antifuses 65 are formed thereby. In one embodiment, one or both of outer capacitor electrode 62 and capacitor dielectric 58 is continuously received over multiple capacitor electrodes 54, with both being shown over multiple capacitor electrodes 54 in the depicted embodiment. In one embodiment, one or both of outer antifuse electrode 62 and antifuse insulative material 60 is continuously received over multiple antifuse electrodes 56, with both being shown over multiple capacitor electrodes 56 in the depicted embodiment. Dielectrics 58 and 60 may be homogenous or non-homogenous, may be of the same composition or of different compositions, and may be deposited at the same time or at different times. Conductive electrodes 62 and 64 may be homogenous or non-homogenous, may be of the same composition or of different compositions, and may be deposited and the same time or at different times. Regardless, one of the pair of the capacitor electrodes 54 or 62 within the respective capacitor openings 40 (i.e., electrode 54) is laterally adjacent to (in one embodiment directly against) deposited insulator 50 in capacitor openings 40. One of the pair of antifuse electrodes 56, 64 within the respective antifuse openings 42 (i.e., antifuse electrode 56) is laterally adjacent to (in one embodiment directly against) deposited insulator 50 in antifuse openings 42.

Appropriate circuitry (not shown) would be associated with electrodes 56 and 64 of antifuses 65 to enable selective programming of individual antifuses 65 (i.e., by breaking down/"blowing" dielectric material 60 within individual openings 42 to cause conductive material to bridge between outer electrode 64 and an individual inner electrode 56). Appropriate circuitry (not shown) would be associated with capacitor electrodes 54 and 62 of capacitors 63 to enable selective operation of individual capacitors 63 that would not include breaking down/"blowing" capacitor dielectric 58 to short electrodes 54 and 62 to one another. In other words, although an antifuse and a capacitor are each an electronic device, antifuses are not capacitors and capacitors are not antifuses in the context of this document. While each may be of the same or similar construction(s) having a pair of electrodes with dielectric there-between, other respective portions of the integrated circuitry would be configured to operate the electronic device either as an antifuse or a capacitor and thereby be determinative of device type. These other respective circuitry portions are not material to embodiments of this invention, and may be existing or later developed circuitry within the skill of the artisan.

Figure 11:
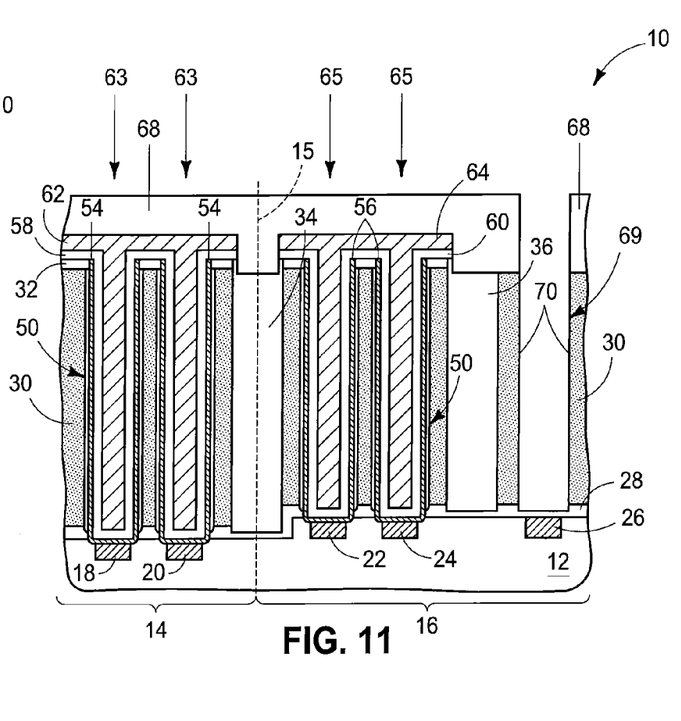
FIG. 11 is a diagrammatic, cross-sectional view of the FIG. 10 substrate at a processing stage subsequent to that of FIG. 10.

Referring to FIG. 11, a dielectric 68 has been deposited and peripheral circuitry contact openings 69 (only one being shown) have been formed into support material 30 within peripheral circuitry area 16. Openings (only one being shown) have been formed through dielectric 68 prior to forming contact openings 69 within support material 30. Support material contact openings 69 have at least one of semiconductive or conductive sidewalls 70 analogous to that described above for sidewalls 44 and 46. Peripheral circuitry contact openings 69 may be formed before or after forming either of capacitor openings 40 and/or antifuse openings 42.

Figure 12:
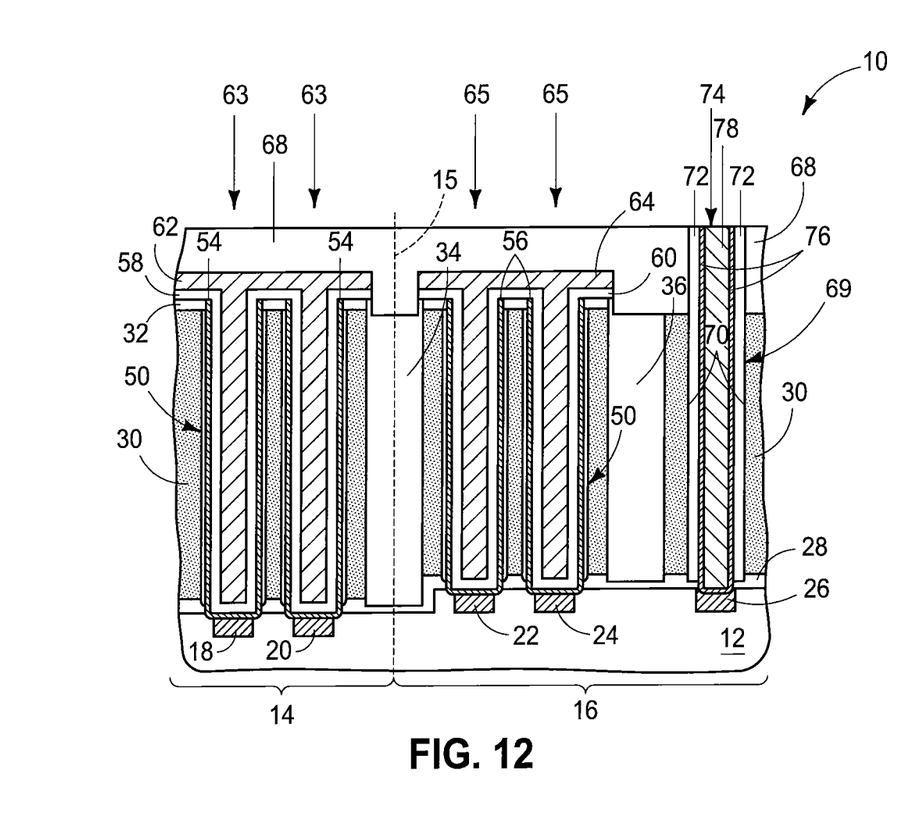
FIG. 12 is a diagrammatic, cross-sectional view of the FIG. 11 substrate at a processing stage subsequent to that of FIG. 11.

Referring to FIG. 12, an insulator 72 has been deposited along semiconductive and/or conductive contact opening sidewalls 70, and a conductive contact 74 has been formed within the respective contact openings 69 laterally of deposited insulator 72 within contact openings 69. In one embodiment, insulator 72 is directly against sidewalls 70, and in one embodiment insulator 72 is directly against conductive contact 74. Insulator 72 may have any of the attributes described above with respect to insulator 50 within capacitor openings 40 and insulator 50 within antifuse openings 42. Conductive contact 74 may be homogenous or non-homogenous, with an example conductive liner 76 and central plugging material 78 being shown (e.g., titanium nitride and tungsten, respectively).

Figure 13:
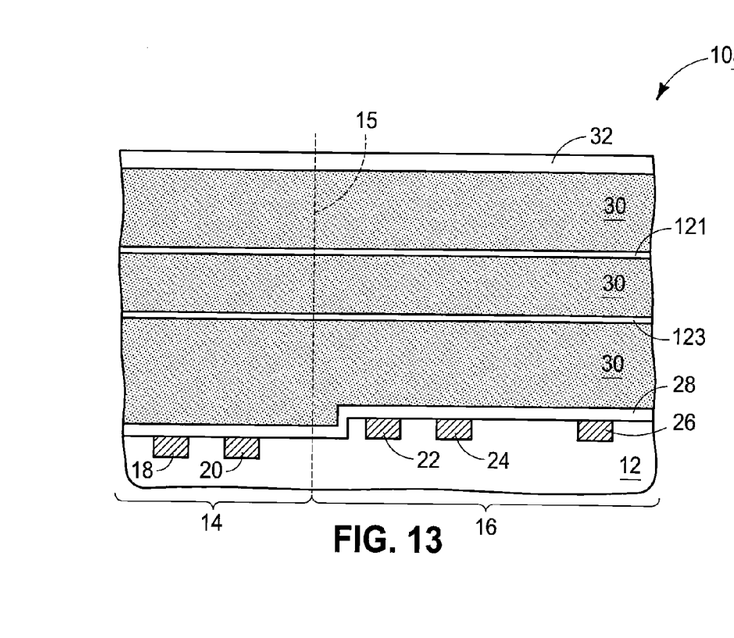
FIG. 13 is a diagrammatic, cross-sectional view of a portion of a semiconductor substrate at a preliminary processing stage of an embodiment in accordance with the invention.

The support material may be considered as having an elevationally outermost (i.e., a top) surface and an elevationally innermost (i.e., a bottom) surface. Some embodiments of the invention comprise providing at least one dielectric layer within conductive and/or semiconductive support material between the elevationally outermost and elevationally innermost surfaces of such support material. An example of such an embodiment is described with reference to FIGS. 13 and 14 with respect to a substrate construction 10a. Like numerals from the above-described embodiments have been used where appropriate, with some construction differences being indicated with the suffix "a" or with different numerals. FIG. 13 corresponds in processing sequence to FIG. 1 of the first-described embodiments. Two dielectric layers 121, 123 are provided within support material 30 between elevationally outermost and elevationally innermost surfaces of support material 30. Only one dielectric layer (not shown) or more than two dielectric layers (not shown) might be used. Regardless, the dielectric layer(s) may be homogenous or non-homogenous, and regardless may be of the same composition or of different compositions relative one another where more than one dielectric layer is provided. Further, the dielectric layer(s) may be continuous or discontinuous over the area where such are, and regardless may not be received within each of array area 14 and peripheral circuitry area 16. The dielectric layer(s) may be formed by alternating depositions of support material 30 and material(s) of the dielectric layer(s).

Figure 14:
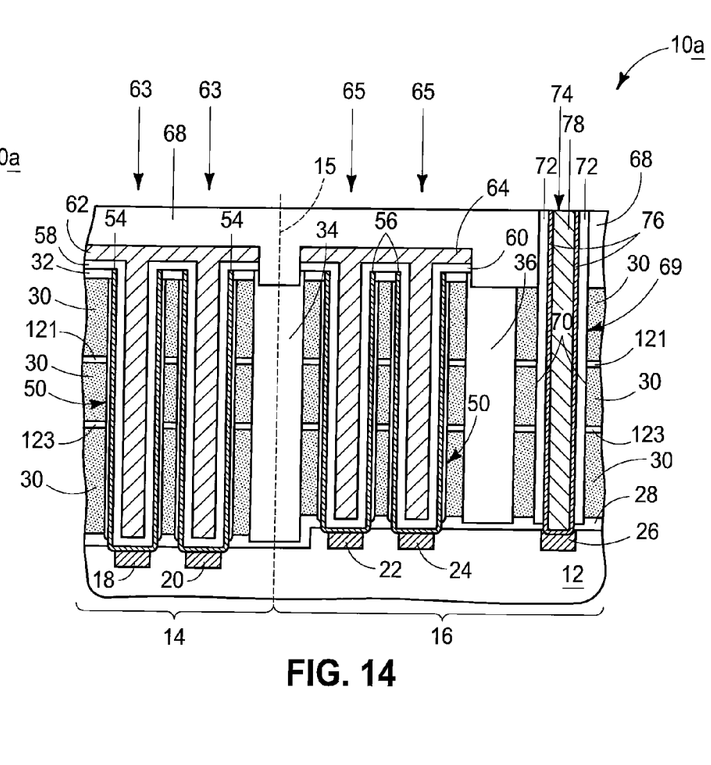
FIG. 14 is a diagrammatic, cross-sectional view of the FIG. 13 substrate at a processing stage subsequent to that of FIG. 13.

FIG. 14 depicts construction 10a at a processing sequence corresponding to that of FIG. 12 of the first-described embodiments. Any of the processing and constructions described above in proceeding from FIG. 1 to FIG. 12 may be used in the embodiment of FIGS. 12 and 14.

In contradistinction to the embodiment of FIGS. 13 and 14, FIGS. 1-12 show processing and construction which is devoid of any dielectric layer within conductive and/or semiconductive support material between elevationally outermost and elevationally innermost surfaces of such support material.

Embodiments of the invention include any of the above constructions as shown and/or described independent of method of manufacture.

CONCLUSION

In some embodiments, methods of forming capacitors comprise providing a support material over a substrate. The support material is at least one of semiconductive or conductive. Openings are formed into the support material. The openings comprise at least one of semiconductive or conductive sidewalls. An insulator is deposited along the semiconductive and/or conductive opening sidewalls. A pair of capacitor electrodes having capacitor dielectric there-between is formed within the respective openings laterally inward of the deposited insulator. One of the pair of capacitor electrodes within the respective openings is laterally adjacent the deposited insulator.

In some embodiments, methods of forming integrated circuitry comprising an array of capacitors and circuitry peripheral to the array comprise providing a support material over a substrate within a capacitor array area and within peripheral circuitry area. The support material is at least one of conductive or semiconductive. Capacitor openings are formed into the support material within the capacitor array area. The capacitor openings comprise at least one of semiconductive or conductive sidewalls. An insulator is deposited along the semiconductive and/or conductive capacitor opening sidewalls. A pair of capacitor electrodes having capacitor dielectric there-between is formed within the respective capacitor openings laterally inward of the deposited insulator in the capacitor openings. One of the pair of capacitor electrodes within the respective capacitor openings is laterally adjacent the deposited insulator in the capacitor openings. Contact openings are formed into the support material within the peripheral circuitry area. The contact openings comprise at least one of semiconductive or conductive sidewalls. An insulator is deposited along the semiconductive and/or conductive contact opening sidewalls. A conductive contact is formed within the respective contact openings laterally inward of the deposited insulator in the contact openings.

In some embodiments, methods of forming integrated circuitry comprising an array of capacitors and circuitry peripheral to the array comprise providing a support material over a substrate within a capacitor array area and within peripheral circuitry area. The support material is at least one of semiconductive or conductive. Capacitor openings are formed into the support material within the capacitor array area. The capacitor openings comprise at least one of semiconductive or conductive sidewalls. An insulator is deposited along the semiconductive and/or conductive capacitor opening sidewalls. A pair of capacitor electrodes having capacitor dielectric there-between is formed within the respective capacitor openings laterally inward of the deposited insulator. One of the pair of capacitor electrodes within the respective capacitor openings is laterally adjacent the deposited insulator in the capacitor openings. Antifuse openings are formed into the support material within the peripheral circuitry area. The antifuse openings comprise at least one of semiconductive or conductive sidewalls. An insulator is deposited along the semiconductive and/or conductive antifuse opening sidewalls. A pair of antifuse electrodes having insulative material there-between is formed within the respective antifuse openings laterally inward of the deposited insulator in the antifuse openings. One of the pair of antifuse electrodes within the respective antifuse openings is laterally adjacent the deposited insulator in the antifuse openings.

In some embodiments, integrated circuitry includes a plurality of electronic devices which individually comprise a pair of conductive electrodes having dielectric there-between. The integrated circuitry includes a substrate comprising support material there-over. The support material is at least one of semiconductive or conductive. Electronic device openings extend into the support material, and comprise at least one of semiconductive or conductive sidewalls. An insulator is along the semiconductive and/or conductive electronic device opening sidewalls. Individual electronic devices are within individual of the electronic device openings laterally inward of the insulator that is along the semiconductive and/or conductive electronic device opening sidewalls. The electronic devices individually comprise a pair of conductive electrodes having dielectric there-between. One of the pair of conductive electrodes within the respective electronic device openings is laterally adjacent the deposited insulator.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming capacitors, comprising:
   forming a support material over a substrate, the support material being at least one of semiconductive or conductive;
   forming openings into the support material, the openings comprising at least one of semiconductive or conductive sidewalls;
   depositing an insulator within the openings along the sidewalls that are at least one of semiconductive or conductive;
   after depositing the insulator, depositing conductive material for a first capacitor electrode within individual of the openings; the conductive material for the first capacitor electrode within the individual openings being laterally adjacent to the insulator;
   after depositing the conductive material for the first capacitor electrodes, depositing capacitor dielectric material within the individual openings over the conductive material for the first capacitor electrode that is within the individual openings; and
   depositing conductive material for a second capacitor electrode within the individual openings over the capacitor dielectric material that is within the individual openings, the insulator being absent between the first and second capacitor electrodes within the individual openings.

2. The method of claim 1 wherein the support material and the support material opening sidewalls are semiconductive.

3. The method of claim 1 wherein the support material and the support material opening sidewalls are conductive.

4. The method of claim 1 wherein the support material comprises a semiconductive portion and a conductive portion, and the opening sidewalls comprise a semiconductive portion and a conductive portion.

5. The method of claim 1 wherein the support material comprises silicon.

6. The method of claim 5 wherein the silicon is amorphous.

7. The method of claim 5 wherein the silicon is monocrystalline.

8. The method of claim 5 wherein the silicon is polycrystalline.

9. The method of claim 8 wherein the polycrystalline silicon is undoped.

10. The method of claim 8 wherein the polycrystalline silicon is doped.

11. The method of claim 1 wherein the support material comprises at least one of gallium nitride and carbon.

12. The method of claim 1 wherein the openings are formed completely through the support material.

13. The method of claim 1 comprising forming dielectric material that is at least one of atop or under the support material and which is directly against the support material, openings being formed into the dielectric material which align with the openings in the support material.

14. The method of claim 1 wherein the depositing of the insulator comprises thermally oxidizing the support material of the opening sidewalls.

15. The method of claim 1 wherein the depositing of the insulator comprises at least one of chemical vapor depositing or atomic layer depositing the insulator along the opening sidewalls.

16. The method of claim 1 wherein the depositing of the insulator comprises:
   thermally oxidizing the support material of the opening sidewalls; and
   at least one of chemical vapor depositing or atomic layer depositing dielectric material laterally over the thermally oxidized support material.

17. The method of claim 1 wherein forming the openings comprises:
   forming first openings into the support material; and
   laterally widening the first openings into wider second openings along which the insulator is deposited.

18. The method of claim 17 wherein forming the first openings comprises anisotropically etching the support material and the laterally widening comprises isotropically etching the support material.

19. The method of claim 1 comprising providing at least one dielectric layer within the support material between top and bottom surfaces of the support material.

20. The method of claim 1 being devoid of any dielectric layer within the support material between top and bottom surfaces of the support material.

21. A method of forming integrated circuitry comprising an array of capacitors and circuitry peripheral to the array, comprising:
   forming support material over a substrate within a capacitor array area and within peripheral circuitry area, the support material being at least one of conductive or semiconductive;
   forming capacitor openings into the support material within the capacitor array area, the capacitor openings comprising at least one of semiconductive or conductive sidewalls;
   depositing an insulator within the capacitor openings along the capacitor opening sidewalls that are at least one of semiconductive or conductive;

after depositing the insulator, depositing conductive material for a first capacitor electrode within individual of the capacitor openings; the conductive material for the first capacitor electrode within the individual capacitor openings being laterally adjacent to the insulator;

after depositing the conductive material for the first capacitor electrodes, depositing capacitor dielectric material within the individual capacitor openings over the conductive material for the first capacitor electrode that is within the individual capacitor openings;

depositing conductive material for a second capacitor electrode within the individual capacitor openings over the capacitor dielectric material that is within the individual capacitor openings, the insulator being absent between the first and second capacitor electrodes within the individual capacitor openings;

forming contact openings into the support material within the peripheral circuitry area, the contact openings comprising at least one of semiconductive or conductive sidewalls;

depositing insulative material within the contact openings along the contact opening sidewalls that are at least one of semiconductive or conductive; and forming a conductive contact within individual of the contact openings radially inward of the deposited insulative material in the contact openings.

22. The method of claim 21 comprising forming dielectric isolation through elevational thickness of the support material and which laterally separates the capacitor array area and the peripheral circuitry area from one another.

23. The method of claim 22 wherein the dielectric isolation is formed before forming the capacitor openings.

24. The method of claim 21 wherein,
the insulative material is deposited directly against the contact opening sidewalls that are at least one of semiconductive or conductive; and
the conductive contact is formed directly against the deposited insulative material.

25. A method of forming integrated circuitry comprising an array of capacitors and circuitry peripheral to the array, comprising:
forming support material over a substrate within a capacitor array area and within peripheral circuitry area, the support material being at least one of semiconductive or conductive;
forming capacitor openings into the support material within the capacitor array area, the capacitor openings comprising at least one of semiconductive or conductive sidewalls;
forming antifuse openings into the support material within the peripheral circuitry area, the antifuse openings comprising at least one of semiconductive or conductive sidewalls;
depositing an insulator within the capacitor openings along the capacitor opening sidewalls that are at least one of semiconductive or conductive and within the antifuse openings along the antifuse opening sidewalls that are at least one of semiconductive or conductive;
after depositing the insulator, depositing conductive material for a first capacitor electrode within individual of the capacitor openings and for a first antifuse electrode within individual of the antifuse openings; the conductive material for the first capacitor electrode within the individual capacitor openings being laterally adjacent to the insulator; the conductive material for the first antifuse electrode within the individual antifuse openings being laterally adjacent to the insulator;

after depositing the conductive material for the first capacitor electrodes and the first antifuse electrodes, depositing dielectric material within the individual capacitor openings over the conductive material for the first capacitor electrode that is within the individual capacitor openings and within the individual antifuse openings over the conductive material for the first antifuse electrode that is within the individual antifuse openings;

depositing conductive material for a second capacitor electrode within the individual capacitor openings over the dielectric material that is within the individual capacitor openings and for a second antifuse electrode within the individual antifuse openings over the dielectric material that is within the individual antifuse openings, the insulator being absent between the first and second capacitor electrodes within individual openings, and not being between the first and second antifuse electrodes within individual openings.

26. The method of claim 25 comprising:
forming contact openings into the support material within the peripheral circuitry area, the contact openings comprising at least one of semiconductive or conductive sidewalls;
depositing insulative material within the contact openings along the contact opening sidewalls that are at least one of semiconductive or conductive; and
forming a conductive contact within individual of the contact openings radially inward of the deposited insulative material in the contact openings.

27. The method of claim 26 wherein the contact openings, the insulative material along the contact opening sidewalls, and the conductive contacts are formed after depositing the conductive material for the second capacitor electrode within the individual capacitor openings over the dielectric material that is within the individual capacitor openings and for the second antifuse electrode within the individual antifuse openings over the dielectric material that is within the individual antifuse openings.

28. The method of claim 25 comprising forming dielectric isolation through elevational thickness of the support material and which laterally separates the capacitor array area and the peripheral circuitry area from one another, the dielectric isolation being formed before depositing the conductive material for the first capacitor electrode within individual of the capacitor openings and for the first antifuse electrode within individual of the antifuse openings.

29. The method of claim 28 comprising forming the dielectric isolation before forming the capacitor and antifuse openings.

30. The method of claim 1 wherein the conductive material for the first capacitor electrode is deposited within the individual openings directly against the insulator.

31. The method of claim 1 wherein the deposited insulator is deposited in two depositions, a first-deposited portion of the two depositions being thinner than a second-deposited portion of the two depositions.

32. The method of claim 1 wherein the deposited insulator is deposited in two depositions, a first-deposited portion of the two depositions being of different composition from a second-deposited portion of the two depositions.

33. The method of claim 32 wherein the first-deposited portion of the two depositions is thinner than the second-deposited portion of the two depositions.

34. The method of claim 1 wherein the insulator is also deposited over a base of the individual openings.

35. The method of claim 34 comprising removing the insulator from being over the opening bases before depositing the conductive material for the first capacitor electrodes.

36. The method of claim 34 wherein the deposited insulator is not atop any of the bases in a finished circuitry construction incorporating the capacitors.

37. The method of claim 1 further comprising forming a first dielectric material between the support material and a conductive node underlying individual of the openings, and wherein forming the openings extends the openings through the support material and only partially into the first dielectric material, the insulator extending only partially into the first dielectric material in a finished circuitry construction incorporating the capacitors, the first capacitor electrodes electrically coupling with individual of the conductive nodes.

38. The method of claim 37 wherein depositing the insulator comprises depositing the insulator over a base of the dielectric material within individual of the openings, followed by removing a portion of the insulator from being over the bases, followed by removing a portion of the first dielectric material to expose the node locations, and followed by depositing the conductive material of the first capacitor electrode.

39. The method of claim 1 wherein the first dielectric material is between the support material and a conductive node underlying individual of the openings and further comprising a second dielectric material is elevationally over an elevationally outermost surface of the support, and wherein the forming the openings extend the openings through the second dielectric material and the support material and only partially into the first dielectric material, the insulator extending only partially into the first dielectric material in a finished circuitry construction incorporating the capacitors, the insulator not extending into any of the second dielectric material in the circuitry construction, the first capacitor electrodes electrically coupling with individual of the conductive nodes.

40. The method of claim 39 wherein depositing the insulator comprises depositing the insulator over a base of the first dielectric material within individual of the openings, followed by removing a portion of the insulator from being over the bases, followed by removing the a portion of the first dielectric material to expose the node locations, and followed by depositing the conductive material of the first capacitor electrode.

\* \* \* \* \*

UNITED STATES PATENT AND TRADEMARK OFFICE
CERTIFICATE OF CORRECTION

PATENT NO. : 9,076,680 B2  
APPLICATION NO. : 13/276125  
DATED : July 7, 2015  
INVENTOR(S) : Brett W. Busch et al.

Page 1 of 1

It is certified that error appears in the above-identified patent and that said Letters Patent is hereby corrected as shown below:

Claims

Column 14, line 18, Claim 40 – Replace "removing the a portion" with --removing a portion--

Signed and Sealed this  
Seventeenth Day of November, 2015

Michelle K. Lee  
*Director of the United States Patent and Trademark Office*